United States Patent
Harrington

(10) Patent No.: US 11,337,340 B2
(45) Date of Patent: May 17, 2022

(54) OPEN AND CLOSED FLOW AIR/COOLANT HYBRID SYSTEM

(71) Applicant: Chilldyne, Inc., Carlsbad, CA (US)

(72) Inventor: Steve Harrington, Cardiff, CA (US)

(73) Assignee: Chilldyne, Inc., Carlsbad, CA (US)

( * ) Notice: Subject to any disclaimer, the term of this patent is extended or adjusted under 35 U.S.C. 154(b) by 453 days.

(21) Appl. No.: 16/589,011

(22) Filed: Sep. 30, 2019

(65) Prior Publication Data
US 2021/0100137 A1 Apr. 1, 2021

(51) Int. Cl.
*H05K 7/20* (2006.01)
*G06F 1/20* (2006.01)

(52) U.S. Cl.
CPC ......... *H05K 7/20836* (2013.01); *G06F 1/206* (2013.01); *H05K 7/202* (2013.01); *H05K 7/20145* (2013.01); *H05K 7/20172* (2013.01); *H05K 7/20209* (2013.01); *H05K 7/20254* (2013.01); *H05K 7/20281* (2013.01); *H05K 7/20736* (2013.01); *H05K 7/20781* (2013.01)

(58) Field of Classification Search
CPC .......... H05K 7/20145; H05K 7/20172; H05K 7/202; H05K 7/20209; H05K 7/20254; H05K 7/20281; H05K 7/20736; H05K 7/20781; H05K 7/20836; H05K 7/20727; H05K 7/20754; H05K 7/20772; G06F 1/206; G06F 1/20; G06F 2200/201
USPC ...................................................... 700/300
See application file for complete search history.

(56) References Cited

U.S. PATENT DOCUMENTS

| | | | |
|---|---|---|---|
| 9,445,529 B2 * | 9/2016 | Chainer | H05K 7/2079 |
| 10,684,661 B1 * | 6/2020 | Thakar | G06F 1/20 |
| 2005/0243516 A1 * | 11/2005 | Stefanoski | H05K 7/20727 361/699 |
| 2007/0274043 A1 * | 11/2007 | Shabany | H05K 7/20645 361/696 |
| 2014/0190681 A1 * | 7/2014 | Chainer | H05K 7/20836 165/289 |
| 2016/0021795 A1 * | 1/2016 | Iyengar | H05K 7/2079 165/287 |
| 2017/0257982 A1 * | 9/2017 | Cheng | H05K 7/20381 |
| 2018/0046232 A1 * | 2/2018 | Wang | H05K 7/20281 |
| 2018/0341298 A1 * | 11/2018 | Cheng | H05K 7/20772 |

* cited by examiner

*Primary Examiner* — Chun Cao
(74) *Attorney, Agent, or Firm* — Manuel de la Cerra

(57) ABSTRACT

A cooling system for a computer server is disclosed. The system includes a flow divider within the server enclosure interior constructed to create a continuous flow path. At least one fan is positioned within the flow path. An inlet air valve is positioned to regulate airflow across the server input air vent. Likewise an outlet air valve is positioned to regulated airflow across the server output air vent. A controller is connected to the fan and the systems has two configurations. A closed loop configuration wherein (1) the inlet air valve is closed preventing airflow across the input air vent; (2) the outlet air valve is closed preventing airflow across the output air vent; and (3) the at least one fan is actuated to propel air, thereby circulating air through the continuous flow path; and an open loop configuration wherein (1) the inlet air valve is opened allowing airflow across the input air vent; and (2) the outlet air valve is opened allowing airflow across the output air vent, thereby drawing air through the input air vent and propelling air out the output air vent.

14 Claims, 7 Drawing Sheets

(Closed and Open Loop)

(Closed Loop)

(Closed Loop)

(Open Loop)

(Open Loop)

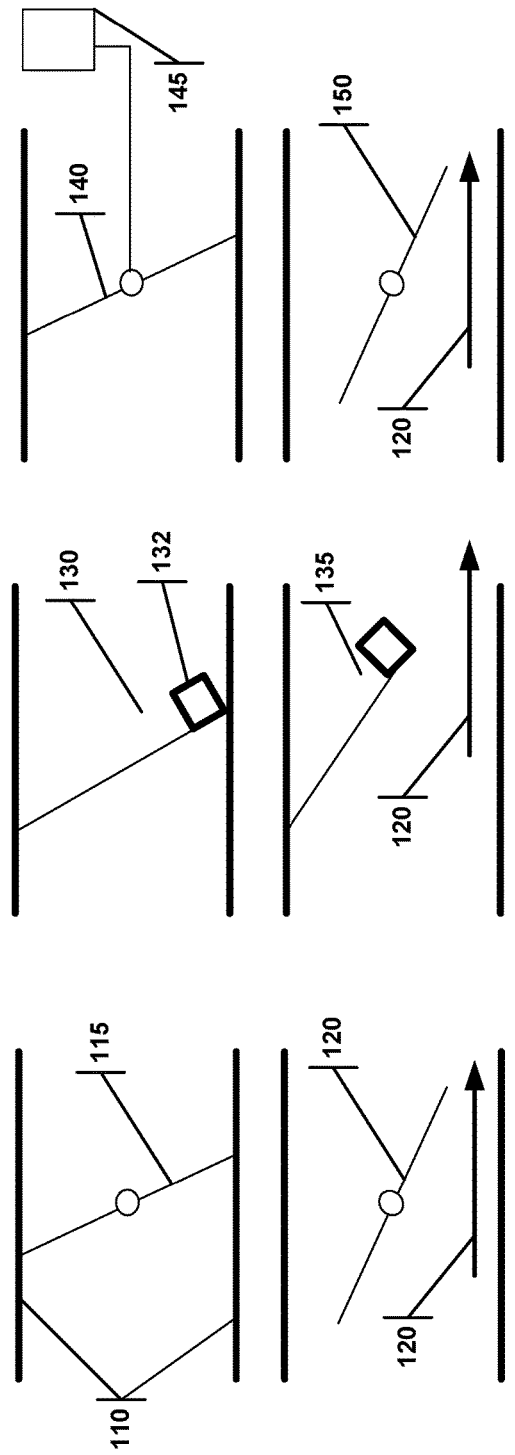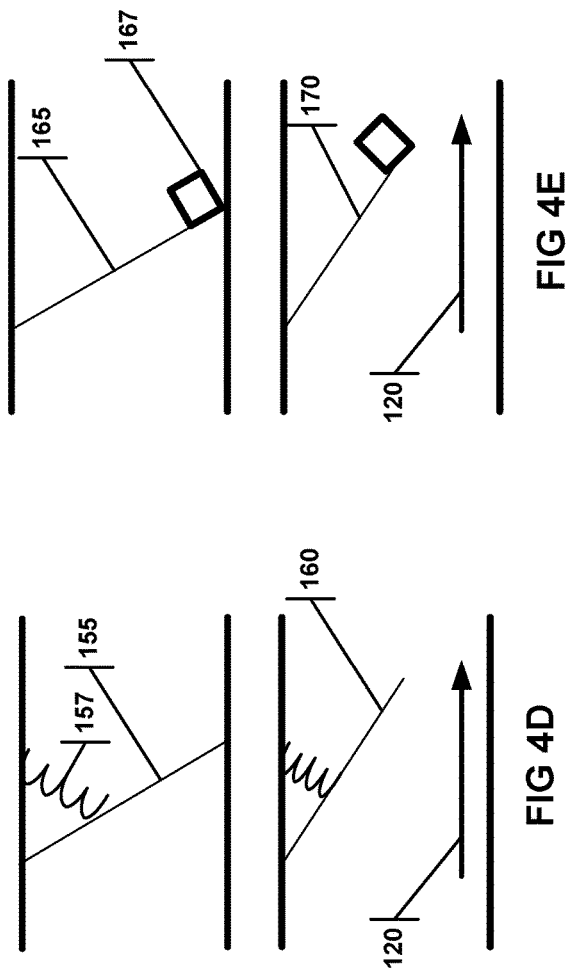

(Closed and Open Loop)

OPEN AND CLOSED FLOW AIR/COOLANT HYBRID SYSTEM

RELATED APPLICATIONS

The present application is related to U.S. patent application Ser. No. 15/782,034, filed on Oct. 12, 2017, which is a continuation of U.S. patent application Ser. No. 14/685,524, filed on Apr. 13, 2015, which is a continuation of U.S. patent application Ser. No. 13/410,558, filed on Mar. 2, 2012, now U.S. Pat. No. 9,010,141 issued on Apr. 21, 2015, which is a non-provisional of U.S. patent application Ser. No. 61/595,989, filed on Feb. 7, 2012. The present application is also related to U.S. patent application Ser. No. 61/451,214, filed on Mar. 10, 2011, U.S. patent application Ser. No. 13/308,208, filed on Nov. 30, 2011, U.S. patent application Ser. No. 61/422,564, filed on Dec. 13, 2010, and U.S. patent application Ser. No. 12/762,898, filed on Apr. 19, 2010. The full disclosure of each of these references is herein incorporated by reference.

TECHNICAL FIELD

The present invention relates to systems and methods for cooling computer systems.

BACKGROUND

Arrays of electronic computers or components, such as those found in data centers, generate a great deal of heat. An example central processing unit of a personal computer ("CPU") generates over 100 watts of heat (some can generate much more than this) and has a maximum case temperature of about 60 C. An example array (or rack) of 88 CPUs may generate 9 kW of heat.

The standard way to keep data centers cool is to use expensive and relatively inefficient vapor-compression refrigeration systems at least part of the time. These conventional cooling or "air conditioning" systems often use more power that the computers themselves, all of which is discharged to the environment as waste heat. These systems use air as the heat transfer medium, and it is due to the low heat capacity and low thermal conductivity of air that refrigeration must be used to remove the heat generated by multiple air heat exchangers. Some operators use evaporation of cooling liquid to cool liquid-to-air heat exchangers. While this is more thermally efficient than refrigeration, the computers run hotter, reducing their reliability, decreasing their efficiency and making the data center uncomfortable for human occupants.

Water is used as the coolant throughout this disclosure, but it will be known to those in the art that other coolants may be used. Water has approximately 4000 times more heat capacity than air of the same volume, so water is a theoretically ideal heat transfer agent for direct heat transfer from heat-generating components. Other coolants offer similar performance. For example, the coolant may consist essentially of water, including tap water, or may comprise one or more perfluorocarbons or avionics cooling liquids. Liquid cooling is recognized as a thermally efficient way to cool computer CPUs due to their high concentration of power and heat generation in a small space, but the rest of a computer's electronics generate heat at a lower rate and temperature, so air-cooling may be more appropriate for much of the associated hardware.

Current systems may use liquid cooling to move the heat from the CPU to a radiator mounted close to the CPU, or they may use an air-to-liquid heat exchanger to remove heat from the computer enclosure. These systems suffer from the high thermal resistance and the bulkiness of air-to-liquid or liquid-to-air heat exchangers. Other systems use a chilled coolant loop to cool the computer, but these systems require complex and expensive connectors and plumbing to connect the server to the building coolant supply while ensuring that no leaks occur, which may be devastating in or near a computer. Accordingly, operators of server systems are rightly concerned about leaks and reliability of using liquids to cool computers. Furthermore, chillers require a large amount of power. Additionally, for operation in a data center, servers, particularly blade servers, need to be compact.

Therefore, what is needed is a compact cooling solution adaptable to cooling a large number of computers.

SUMMARY

The present invention provides an elegant solution to the needs described above and offers numerous additional benefits and advantages, as will be apparent to persons of skill in the art. A cooling system for a computer server is disclosed. The system includes a flow divider within the server enclosure interior constructed to create a continuous flow path. At least one fan is positioned within the flow path. An inlet air valve is positioned to regulate airflow across the server input air vent. Likewise, an outlet air valve is positioned to regulated airflow across the server output air vent. A controller is connected to the at least one fan, and the systems has two configurations. The first is a closed-loop configuration wherein (1) the inlet air valve is closed, preventing airflow across the input air vent; (2) the outlet air valve is closed, preventing airflow across the output air vent; and (3) the at least one fan is actuated to propel air, thereby circulating air throughout the continuous flow path. The second is an open-loop configuration wherein (1) the inlet air valve is opened, allowing airflow across the input air vent; and (2) the outlet air valve is opened, allowing airflow across the output air vent, thereby drawing air through the input air vent and propelling air out the output air vent.

The system may have at least two fans within the flow path, such that the closed-loop configuration further includes actuating the fans to propel air in different directions, thereby circulating air through the continuous flow path; and the open-loop configuration further includes actuating the two fans to propel air in the same direction.

The system may have a temperature sensor within in the server enclosure interior, which is connected to the controller, which may change the system configuration based on the temperature detected by the temperature sensor. The controller may actuate the open-loop configuration when the temperature detected by the sensor exceeds a predetermined value.

The server is liquid-cooled, and the system may have a temperature sensor constructed to detect the temperature of the liquid coolant. The sensor is connected to the controller, and the controller may change the system configuration based on the temperature detected by the temperature sensor. The controller may actuate the open-loop configuration when the temperature detected by the sensor exceeds a predetermined value.

The server includes a liquid-cooled cold plate that is coupled to a heat-generating device, such as a CPU, and is also coupled to an air heat exchanger, such as a set of fins on top of the cold plate.

The controller may change the system configuration by controlling the speed and direction of the at least one fan.

The inlet air valve and outlet air valve may be passively opened and closed based on the speed of the at least one fan. The inlet air valve and outlet air valve may be actuated by servos controlled by the controller. The inlet air valve and outlet air valve may be a butterfly air valve, a magnetic check air valve, a servo-actuated air valve, a spring check air valve, a weighted check air valve, and combinations thereof.

Additional aspects, alternatives and variations as would be apparent to persons of skill in the art are also disclosed herein and are specifically contemplated as included as part of the invention. The invention is set forth only in the claims as allowed by the patent office in this or related applications, and the following summary descriptions of certain examples are not in any way to limit, define or otherwise establish the scope of legal protection.

BRIEF DESCRIPTION OF THE DRAWINGS

The invention can be better understood with reference to the following figures. The components within the figures are not necessarily to scale, emphasis instead being placed on clearly illustrating example aspects of the invention. In the figures, like reference numerals designate corresponding parts throughout the different views and/or embodiments. Furthermore, various features of different disclosed embodiments can be combined to form additional embodiments, which are part of this disclosure. It will be understood that certain components and details may not appear in the figures to assist in more clearly describing the invention.

FIG. 4A illustrates a butterfly air valve in the open and closed configurations.

FIG. 4B illustrates a magnetic check air valve in the open and closed configurations.

FIG. 4C illustrates a servo-actuated air valve in the open and closed configurations.

FIG. 4D illustrates a spring check air valve in the open and closed configurations.

FIG. 4E illustrates a weighted-check air valve in the open and closed configurations.

DETAILED DESCRIPTION

Figure 1:
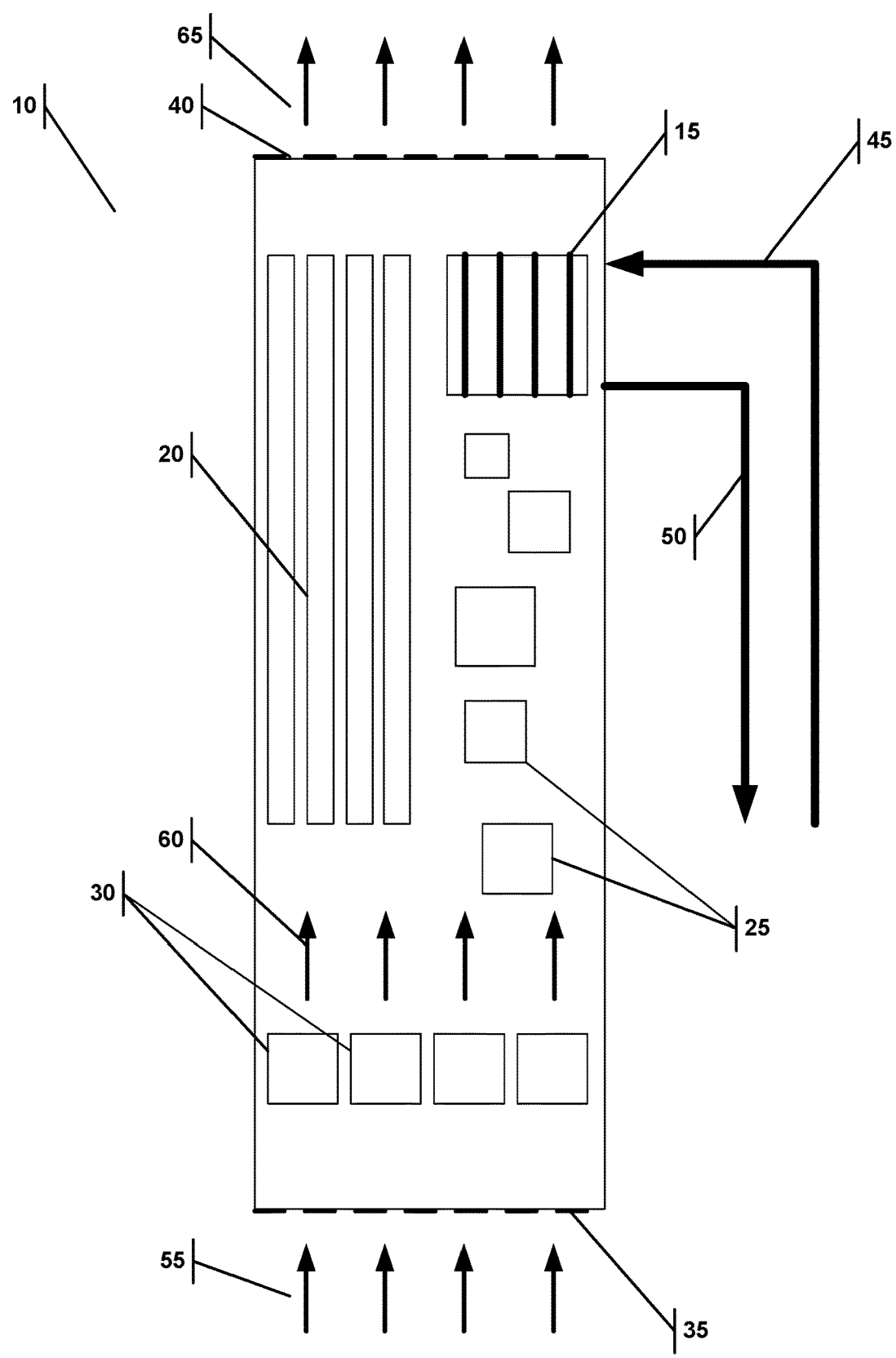
FIG. 1 depicts a computer server with liquid coolant.

Reference is made herein to some specific examples of the present invention, including any best modes contemplated by the inventor for carrying out the invention. Examples of these specific embodiments are illustrated in the accompanying figures. While the invention is described in conjunction with these specific embodiments, it will be understood that it is not intended to limit the invention to the described or illustrated embodiments. To the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, process operations well known to persons of skill in the art have not been described in detail in order not to obscure unnecessarily the present invention. Various techniques and mechanisms of the present invention will sometimes be described in singular form for clarity. However, it should be noted that some embodiments include multiple iterations of a technique or multiple mechanisms unless noted otherwise. Similarly, various steps of the methods shown and described herein are not necessarily performed in the order indicated, or performed at all in certain embodiments. Accordingly, some implementations of the methods discussed herein may include more or fewer steps than those shown or described. Further, the techniques and mechanisms of the present invention will sometimes describe a connection, relationship or communication between two or more entities. It should be noted that a connection or relationship between entities does not necessarily mean a direct, unimpeded connection, as a variety of other entities or processes may reside or occur between any two entities. Consequently, an indicated connection does not necessarily mean a direct, unimpeded connection, unless otherwise noted.

The following list of example features corresponds with the attached figures and is provided for ease of reference, where like reference numerals designate corresponding features throughout the specification and figures:

| | |
|---|---|
| 10 | Computer Server |
| 12 | Enclosure Interior |
| 15 | CPU with Cooling Fins and Cold Plate |
| 20 | Memory Module |
| 25 | Server Components |
| 30 | Fans |
| 30A | First set of fans |
| 30B | Second set of fans |
| 35 | Input Air Vents |
| 40 | Output Air Vents |
| 45 | Input Coolant Line |
| 50 | Output Coolant Line |
| 55 | Input Drawn Air |
| 60 | Interior Propelled Air |
| 65 | Output Propelled Air |
| 70 | Inlet Air Valve (Closed) |
| 75 | Outlet Air Valve (Closed) |
| 76 | Interior Air Temperature Sensor |
| 77 | Coolant Temperature Sensor |
| 78 | Controller |
| 80 | Closed Loop Reverse Flow Direction |
| 85 | Interior Channel Wall/Flow Divider |
| 90 | Recirculating Interior Air Flow |
| 92 | Continuous Air Flow Path |
| 95 | Inlet Air Valve (Open) |
| 100 | Outlet Air Valve (Open) |
| 105 | Open Loop Air Flow Direction |
| 110 | Air Valve Walls |
| 115 | Butterfly Air Valve (Closed) |
| 120 | Butterfly Air Valve (Open) |
| 125 | Open Valve Air Flow |
| 130 | Magnetic Check Air Valve (Closed) |
| 132 | Magnet |
| 135 | Magnetic Check Air Valve (Open) |
| 140 | Servo Actuated Air Valve (Closed) |
| 145 | Servo |
| 150 | Servo Actuated Air Valve (Open) |
| 155 | Spring Check Air Valve (Closed) |
| 157 | Spring |
| 160 | Spring Check Air Valve (Open) |
| 165 | Weighted Check Air Valve (Closed) |
| 167 | Weight |

| | |
|---|---|
| 170 | Weighted Check Air Valve (Open) |
| 175 | First Flow Path |
| 180 | Second Flow Path |

Turning to FIG. 1, a computer server 10 is shown, which has a server enclosure interior 12. The server 10 has a CPU 15 that has cooling fins and a cold plate, memory modules 20 and various other server components 25. Further descriptions of example embodiments of the cooling fins and a cold plate may be found in the related applications cited above and incorporated by reference. Fans 30 draw air 55 through the input air vents 35, propelling air 60 over the various serve electronics and through the output air vent 40 as hotter output propelled air 65. The CPU 15 may have an input 45 and an output 50 coolant line to help cool off the CPU 15, which is generally the highest power generating component within the server 10.

Figure 2:
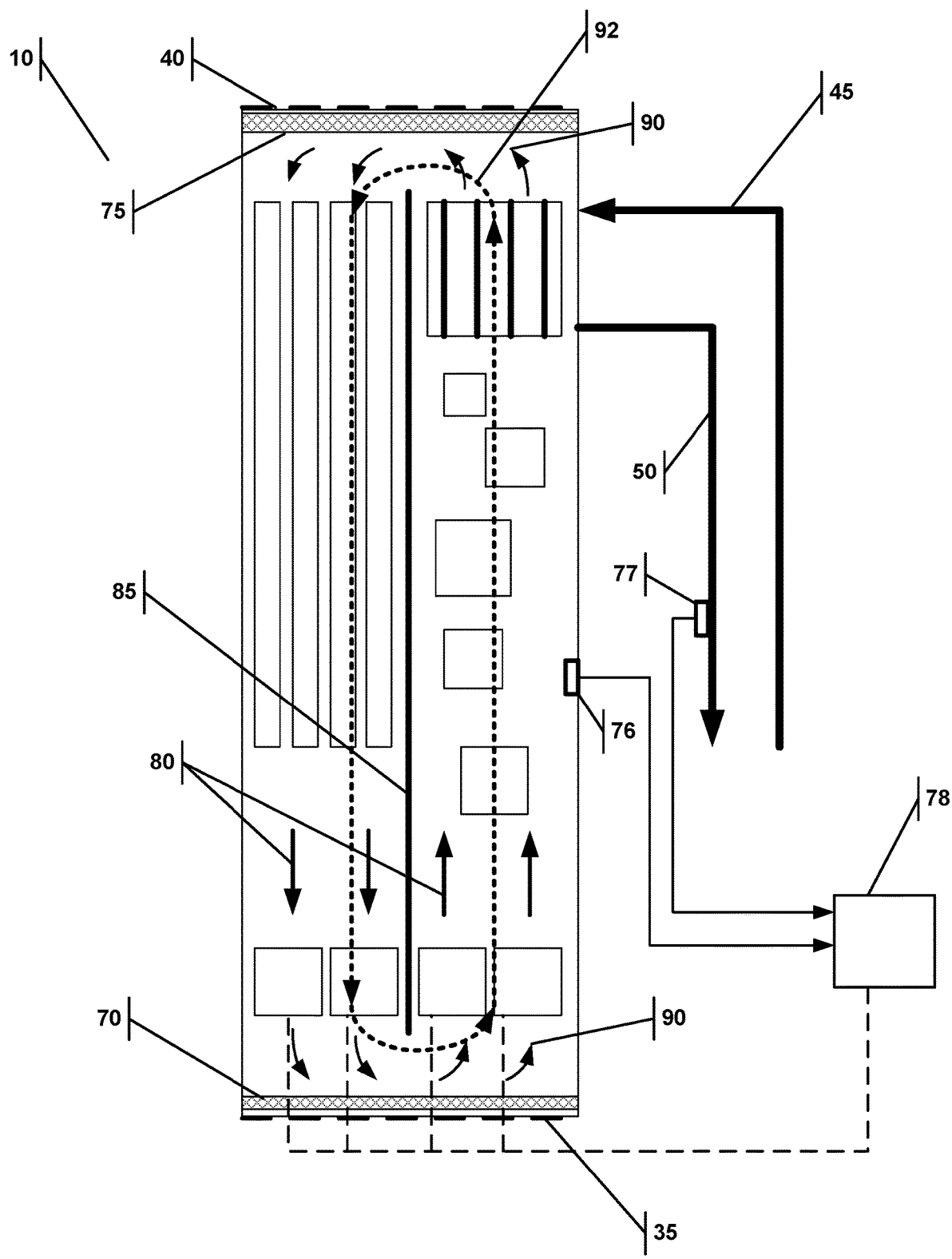
FIG. 2 depicts a computer server with a channel wall/flow divider in a closed-loop configuration.

FIG. 2 illustrates the cooling system in the closed-loop configuration. A flow divider 85 is positioned within the enclosure interior to create a continuous flow path 92, along which air can be recirculated. A first set of fans 30A are reversed so as to propel air in a different direction than that of the second set of fans 30B. The first set of fans 30A are on the opposite side of the flow divider 85 as the second set of fans 30B.

Figure 3:
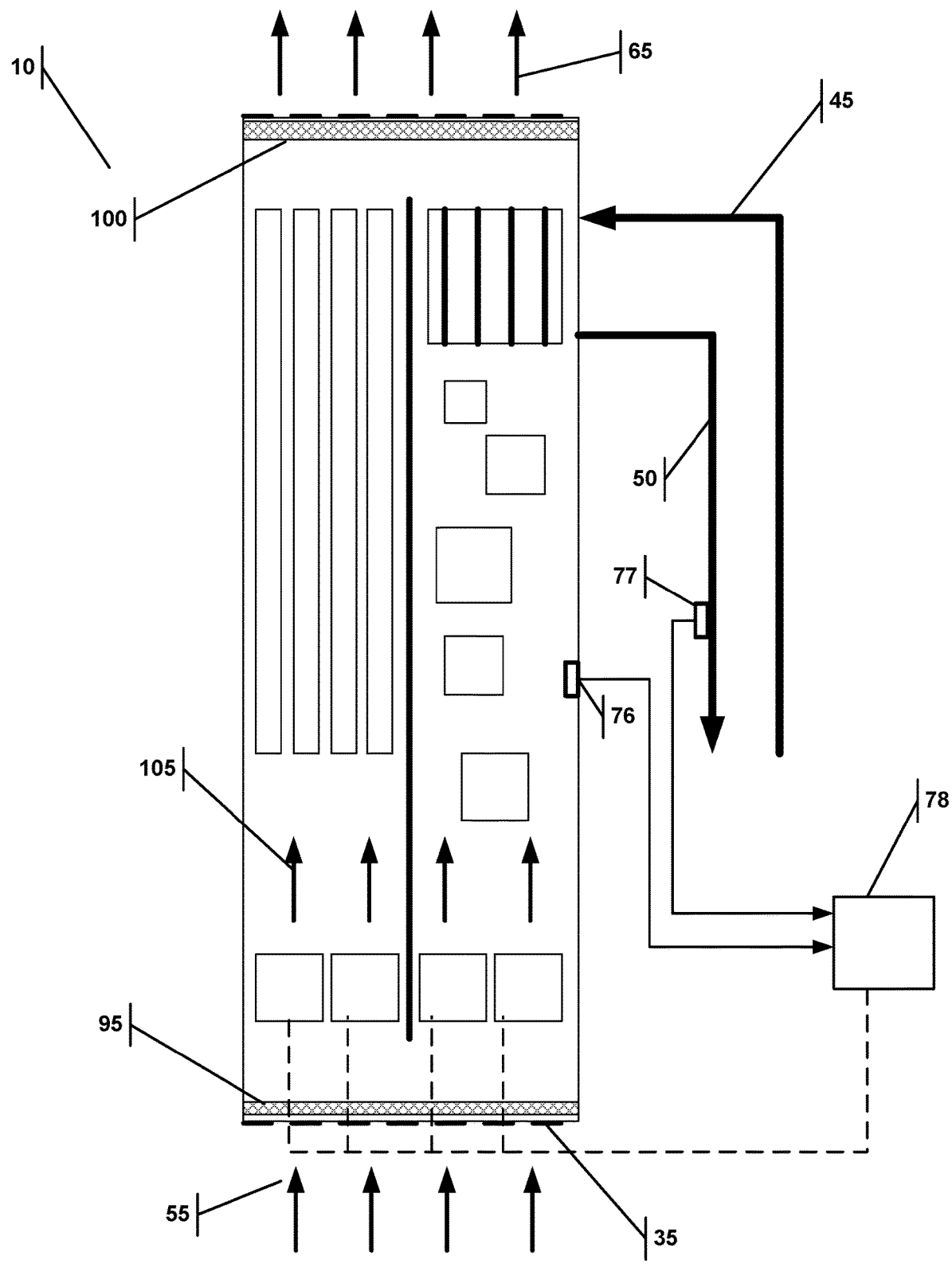
FIG. 3 depicts a computer server with a channel wall/flow divider in an open-loop configuration.

An inlet air valve 70 is positioned to regulate airflow across the input air vent, and likewise an outlet air valve 75 is positioned to regulate airflow across the output air vent. In the closed configuration, both the inlet air valve 70 and the outlet air valve 75 are closed, preventing air flow across their respective vents. A controller 78 operates the fan speed and direction. A temperature sensor 76 may sense the temperature of the enclosure interior and send this information to the controller. Instead, or in addition to the aforementioned, a temperature sensor 77 may be placed on the coolant line 50 to detect the temperature of the liquid coolant. The components within the server 10 may also have temperature sensors, which may be used. The controller 78 may use the information from these sensors to toggle between the closed-loop configuration (FIG. 2) and the open-loop configuration (FIG. 3). For example, should the readings from the sensor exceed a predetermined temperature, then the controller may actuate the open-loop configuration to allow the server to cool more quickly.

In the closed-loop configuration shown in FIG. 2, the recirculated air flow 90 within the enclosure interior flows over the cooling fins of the CPU 15, which allows the heat to exchange with the liquid coolant, such that substantially all the heat from the server is evacuated throughout the liquid coolant. Specifically, the fins on the CPU cold plate 25 absorb the heat transferred from the lower power components through the air, while the liquid coolant in the cold plate absorbs the heat transferred from the high-powered CPU in contact with the cold plate. The liquid-cooled cold plate (15) with an extended heat transfer area constructed to transfer heat from the air to the liquid and a direct contact heat transfer surface to remove heat from an electronic device. Thus, in the closed-loop configuration, servers can be placed into an enclosed area or room without the need for a room air conditioner to evacuate the hot air from the servers.

In the event that the system is not cooling the server enough, the system can be run in an open-loop configuration shown in FIG. 3. In this configuration, (1) the inlet air valve is opened, allowing airflow across the input air vent; (2) the outlet air valve is opened, allowing airflow across the output air vent; and (3) the fans are actuated by the controller to propel air in the same direction, thereby drawing air through the input air vent and propelling air out through the output air vent.

Figure 2A:
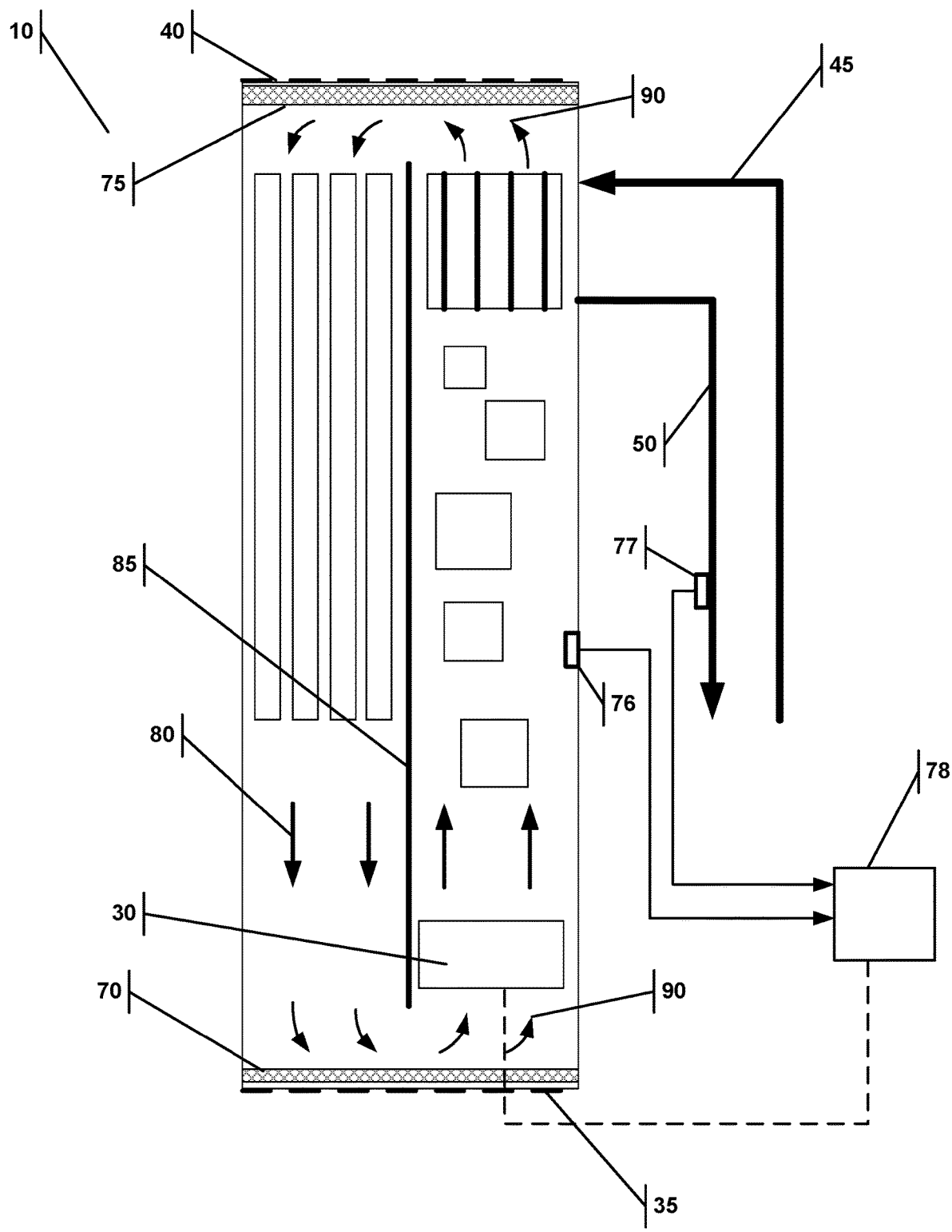
FIG. 2A depicts a computer server with a channel wall/flow divider in a closed-loop configuration, when only one fan is used.
Figure 3A:
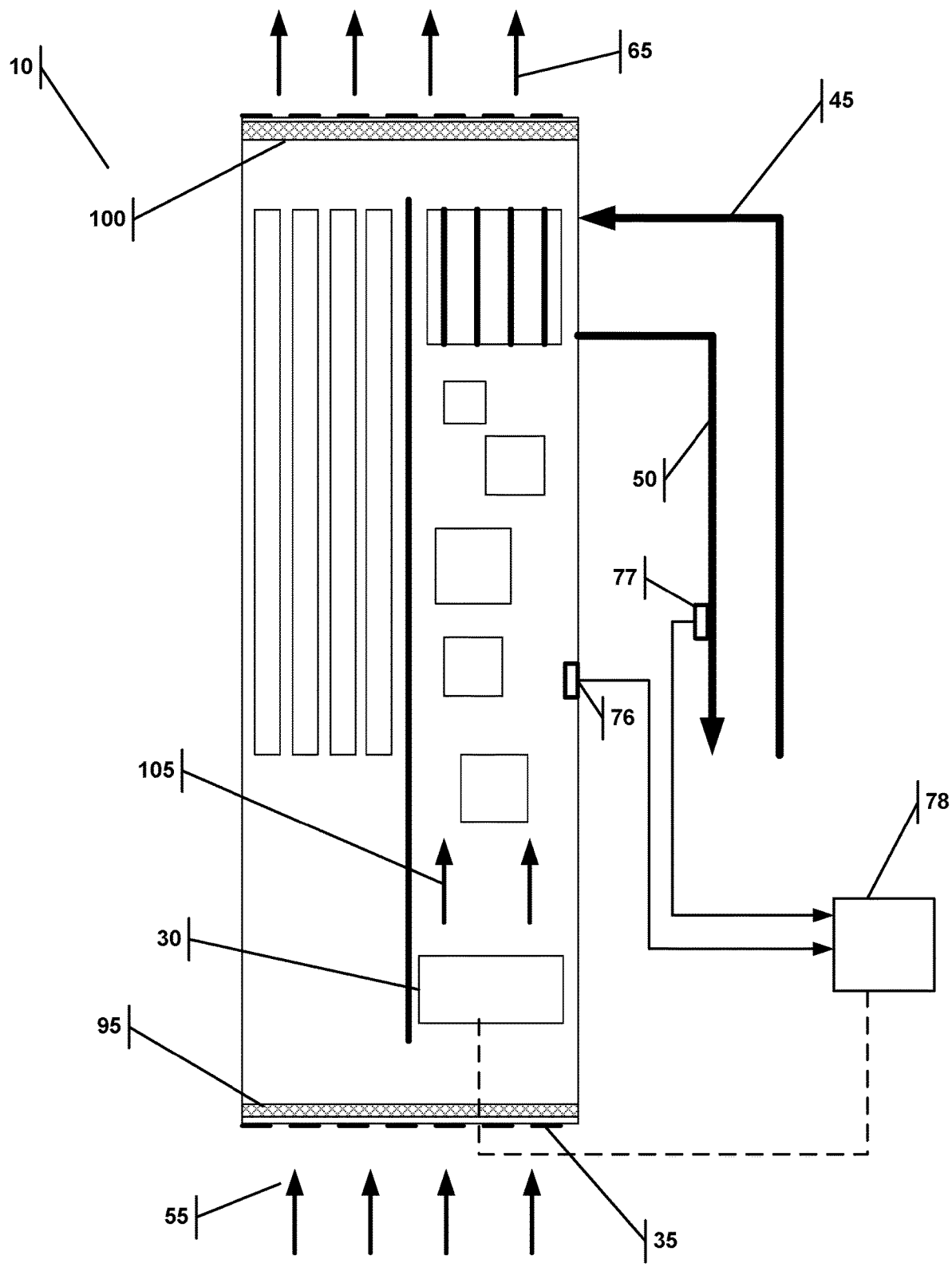
FIG. 3A depicts a computer server with a channel wall/flow divider in an open-loop configuration, when only one fan is used.

The valves may be actuated via the fan connectors on the motherboard. These connectors provide power and PWM signals to control fans. These connectors can easily be adapted to control the position of servo-actuated valves instead. While the above description and associated diagram discuss two or more fans, the system may use a single fan. This is shown in FIGS. 2A and 3A. Specifically in 2A, the single-fan closed loop would allow the air to circulate in a continuous air flow path 92. The single-fan open loop (FIG. 3A) would allow a flow on one side of the flow divider 85. To further increase cooling efficiency, the flow divider 85 may be positioned to place the high heat-generating components on the same side where there is air flow in the open loop.

Figure 5:
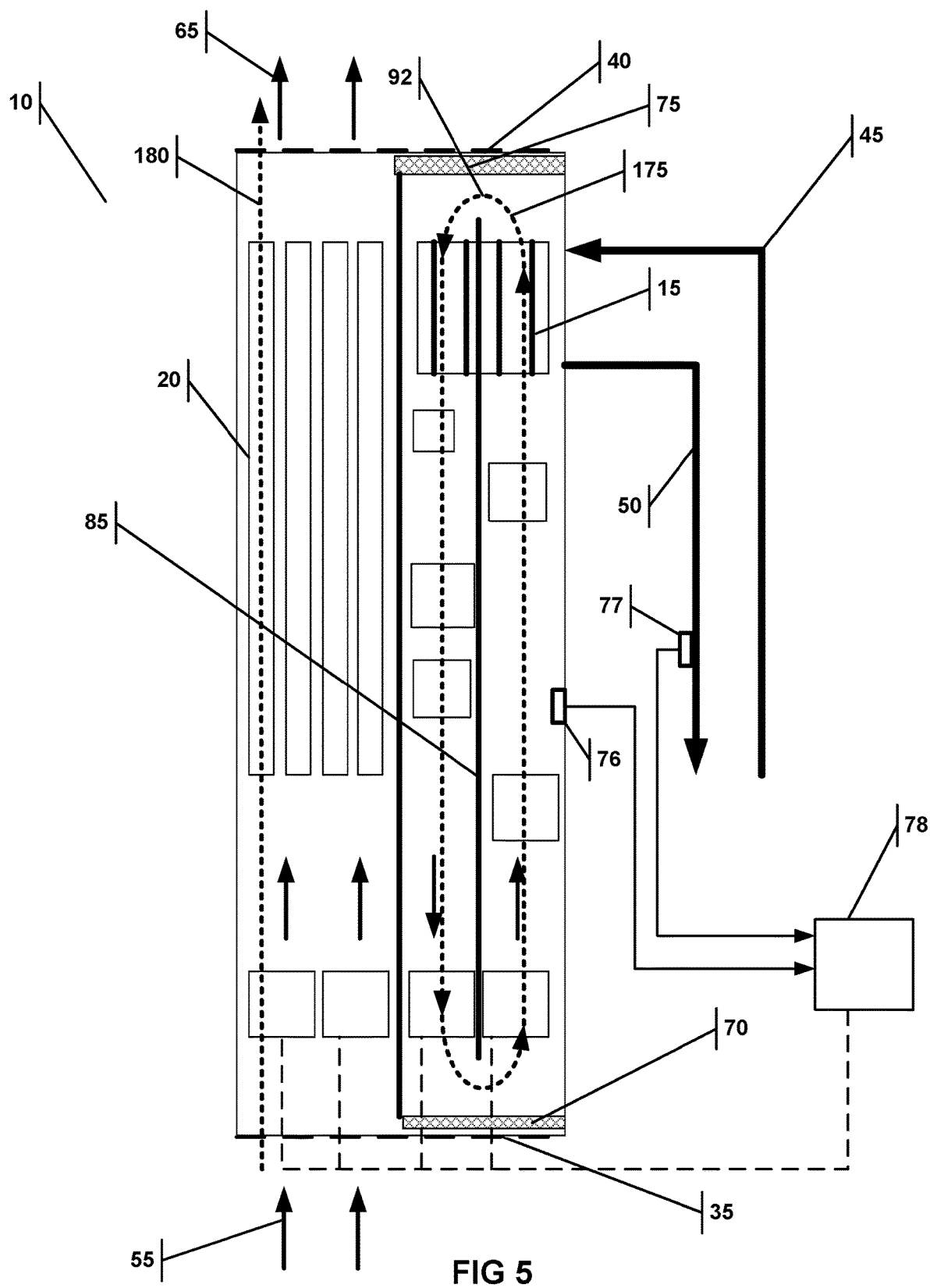
FIG. 5 illustrates a continuous flow path that covers a portion of the server components.

FIG. 5 illustrates an embodiment where the server enclosure interior has essential two separate flow paths—with the open/closed loop capability limited to only part of the server 10 within the same enclosure. The first flow path 17 may be closed or open as described above and may be used to cool components that are not as heat-sensitive or have lower power. The second flow path 180 may be used for components that require high cooling. In other words, the continuous flow path covers only a portion of the server. For example there may be a flow path that includes memory modules 20 or communication chips that need extra cooling, while the rest of the server may be cooled using recirculating flow over the finned cold plate 15 in a separate flow path.

The open flow path configuration is used as a failsafe for the system to prevent overheating. It is also used when user are testing their servers for proper operation. For example, the user may have only one server connected and would like to test that server. Instead of connecting a coolant liquid line to begin testing, the user may direct the controller to place the server in the open configuration, which will provide enough cooling capacity to run the test. When the user is satisfied that server operates correctly, then the server may be the connected to the coolant liquid. If the server is not operating correctly, then the server can be disassembled without having to drain coolant.

Various types of air valves could be used to change the flow pattern. Referring to FIG. 4A, a butterfly valve is shown in the closed 115 and open 120 configurations. This valve is designed such that aerodynamic forces open the valve once the pressure is enough within the interior of the server. This is generally when the fans are switched to flow in the same direction and at a higher flow rate. This would cause the air valve to open in the event that the coolant system fails or is otherwise not cooling the server within the expected specifications. The benefit of the butterfly valve shown in FIG. 4A is that it is passively actuated by the operation of the fans 30. This reduces the complexity of the system and reduces the likelihood of potential failure points. FIGS. 4B, 4D and 4E similarly illustrate passive air valves comprising a magnetic check air valve, spring check air valve and weighted check air valve, respectively. FIG. 4C illustrates a servo-actuated air valve in both the open 150 and closed 140 configurations. The servo 145 may be controlled by the controller 78.

Various example systems have been shown and described having various aspects and elements. Unless indicated otherwise, any feature, aspect or element of any of these systems may be removed from, added to, combined with or modified by any other feature, aspect or element of any of the systems. As will be apparent to persons skilled in the art, modifications and adaptations to the above-described systems and methods can be made without departing from the spirit and scope of the invention, which is defined only by the following claims. Moreover, the applicant expressly does not intend that the following claims "and the embodiments in the specification to be strictly coextensive." Phillips v. AHW Corp., 415 F.3d 1303, 1323 (Fed. Cir. 2005) (en banc).

The invention claimed is:

1. A cooling system for a computer server, the server having an enclosure interior, an input air vent and an output air vent, the system comprising:
a liquid-cooled cold plate with an extended heat transfer area constructed to transfer heat from the air to the liquid and a direct contact heat transfer surface to remove heat from an electronic device;
a flow divider within the enclosure interior constructed to create a continuous flow path;
at least one fan within the flow path;
an inlet air valve constructed to regulate airflow across the input air vent;
an outlet air valve constructed to regulate airflow across the output air vent;
a controller connected to the fans;
the system having two configurations:
a closed-loop configuration wherein (1) the inlet air valve is closed, preventing airflow across the input air vent; (2) the outlet air valve is closed, preventing airflow across the output air vent; and (3) the at least one fan is actuated to propel air, thereby circulating air throughout the continuous flow path;
an open-loop configuration wherein (1) the inlet air valve is opened, allowing airflow across the input air vent; and (2) the outlet air valve is opened, allowing airflow across the output air vent, thereby drawing air through the input air vent and propelling air through the output air vent.

2. The cooling system of claim 1, further comprising:
at least two fans within the flow path;
wherein the closed-loop configuration further comprises actuating the at least two fans to propel air in different directions, thereby circulating air throughout the continuous flow path; and
wherein the open-loop configuration further comprises the at least two fans are actuated to propel air in the same direction.

3. The cooling system of claim 2, wherein the at least two fans are on opposite sides of the flow divider.

4. The cooling system of claim 1, further comprising a temperature sensor within the enclosure interior, wherein the temperature sensor is connected to the controller.

5. The cooling system of claim 4, wherein the controller changes the system configuration based on the temperature detected by the temperature sensor.

6. The cooling system of claim 5, wherein the controller actuates the open-loop configuration when the temperature detected by the sensor exceeds a predetermined value.

7. The cooling system of claim 1, wherein the server is liquid-cooled, and the system comprises a temperature sensor constructed to detect the temperature of the liquid coolant, and the temperature sensor is connected to the controller.

8. The cooling system of claim 7, wherein the controller changes the system configuration based on the temperature detected by the temperature sensor.

9. The cooling system of claim 8, wherein the controller actuates the open-loop configuration when the temperature detected by the sensor exceeds a predetermined value.

10. The cooling system of claim 1, wherein the controller changes the system configuration by controlling the speed and direction of the at least one fan.

11. The cooling system of claim 1, wherein the inlet air valve and the outlet air valve are passively opened and closed based on the speed of the at least one fan.

12. The cooling system of claim 1, wherein the inlet air valve and the outlet air valve are actuated by servos controlled by the controller.

13. The cooling system of claim 1, wherein the inlet air valve and the outlet air valve are selected from a group consisting of: a butterfly air valve, a magnetic check air valve, a servo-actuated air valve, a spring check air valve, a weighted check air valve, and combinations thereof.

14. The cooling system of claim 1, wherein the continuous flow path covers only a portion of the server.

* * * * *